US012689352B2

(12) United States Patent
    Sato et al.

(10) Patent No.: US 12,689,352 B2
(45) Date of Patent: Jul. 21, 2026

(54) ACOUSTIC WAVE DEVICE, FILTER, AND MULTIPLEXER

(71) Applicant: TAIYO YUDEN CO., LTD., Tokyo (JP)

(72) Inventors: Koichi Sato, Tokyo (JP); Shinji Yamamoto, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 129 days.

(21) Appl. No.: 18/435,564

(22) Filed: Feb. 7, 2024

(65) Prior Publication Data

US 2024/0283426 A1      Aug. 22, 2024

(30) Foreign Application Priority Data

Feb. 22, 2023      (JP) ................................. 2023-026551

(51) Int. Cl.
    *H03H 9/13*       (2006.01)
    *H03H 9/05*       (2006.01)
    *H03H 9/15*       (2006.01)
    *H03H 9/56*       (2006.01)
    *H03H 9/70*       (2006.01)

(52) U.S. Cl.
    CPC ............... *H03H 9/13* (2013.01); *H03H 9/05* (2013.01); *H03H 9/15* (2013.01); *H03H 9/568* (2013.01); *H03H 9/70* (2013.01)

(58) Field of Classification Search
    CPC .. H03H 9/13; H03H 9/05; H03H 9/15; H03H 9/568; H03H 9/70; H03H 9/02559; H03H 9/02574; H03H 9/02834; H03H 9/02866

USPC ..................................................... 333/193–196
    See application file for complete search history.

(56) References Cited

U.S. PATENT DOCUMENTS

2020/0389148 A1   12/2020   Vo et al.
2022/0038071 A1    2/2022   Nakazato et al.
2023/0208395 A1*   6/2023   Yamamoto ......... H03H 9/02834
                                              333/193

FOREIGN PATENT DOCUMENTS

JP       2020-510354 A      4/2020
JP       2022-025374 A      2/2022

* cited by examiner

*Primary Examiner* — Jorge L Salazar, Jr.
(74) *Attorney, Agent, or Firm* — Stein IP, LLC

(57) ABSTRACT

An acoustic wave device includes a support substrate, a piezoelectric layer provided on the support substrate, at least one pair of comb-shaped electrodes provided on the piezoelectric layer, the at least one pair of comb-shaped electrodes including a plurality of electrode fingers, a first intermediate layer provided between the support substrate and the piezoelectric layer, a second intermediate layer provided between the support substrate and the first intermediate layer, the second intermediate layer having a porosity higher than a porosity of the first intermediate layer, and a third intermediate layer provided between the support substrate and the second intermediate layer, the third intermediate layer having a porosity lower than the porosity of the second intermediate layer.

19 Claims, 10 Drawing Sheets

POROSITY

ACOUSTIC WAVE DEVICE, FILTER, AND MULTIPLEXER

CROSS-REFERENCE TO RELATED APPLICATION

This application is based upon and claims the benefit of priority of the prior Japanese Patent Application No. 2023-026551, filed on Feb. 22, 2023, the entire contents of which are incorporated herein by reference.

FIELD

A certain aspect of the present disclosure relates to an acoustic wave device, a filter, and a multiplexer.

BACKGROUND

A surface acoustic wave resonator is known as an acoustic wave resonator used in a communication device such as a smartphone. It is known to bond a piezoelectric layer forming a surface acoustic wave resonator to a support substrate. It is known to provide an attenuation layer having pores between the support substrate and the piezoelectric layer as disclosed in, for example, Japanese Translation of PCT International Publication No. 2020-510354 (Patent Document 1). It is known to provide an intermediate layer having a low Q factor between the support substrate and the piezoelectric layer as disclosed in, for example, Japanese Patent Application Laid-Open No. 2022-025374 (Patent Document 2).

SUMMARY

When an intermediate layer such as an attenuation layer having pores is provided so as to be in contact with the support substrate, the intermediate layer may be peeled off from the support substrate.

An object of the present disclosure is to inhibit peeling of the intermediate layer having pores from the support substrate.

In one aspect of the present disclosure, there is provided an acoustic wave device including: a support substrate; a piezoelectric layer provided on the support substrate; at least one pair of comb-shaped electrodes provided on the piezoelectric layer, the at least one pair of comb-shaped electrodes including a plurality of electrode fingers; a first intermediate layer provided between the support substrate and the piezoelectric layer; a second intermediate layer provided between the support substrate and the first intermediate layer, the second intermediate layer having a porosity higher than a porosity of the first intermediate layer; and a third intermediate layer provided between the support substrate and the second intermediate layer, the third intermediate layer having a porosity lower than the porosity of the second intermediate layer.

In another aspect of the present disclosure, there is provided an acoustic wave device including: a support substrate; a piezoelectric layer provided on the support substrate; at least one pair of comb-shaped electrodes provided on the piezoelectric layer, the at least one pair of comb-shaped electrodes including a plurality of electrode fingers; a first intermediate layer provided between the support substrate and the piezoelectric layer; a second intermediate layer provided between the support substrate and the first intermediate layer, the second intermediate layer having a Q factor smaller than a Q factor of the first intermediate layer; and a third intermediate layer provided between the support substrate and the second intermediate layer, the third intermediate layer having a Q factor larger than the Q factor of the second intermediate layer.

In another aspect of the present disclosure, there is provided a filter including the above acoustic wave device.

In another aspect of the present disclosure, there is provided a multiplexer including the above filter.

DETAILED DESCRIPTION

Hereinafter, embodiments of the present disclosure will be described with reference to the accompanying drawings.

First Embodiment

Figure 1A:
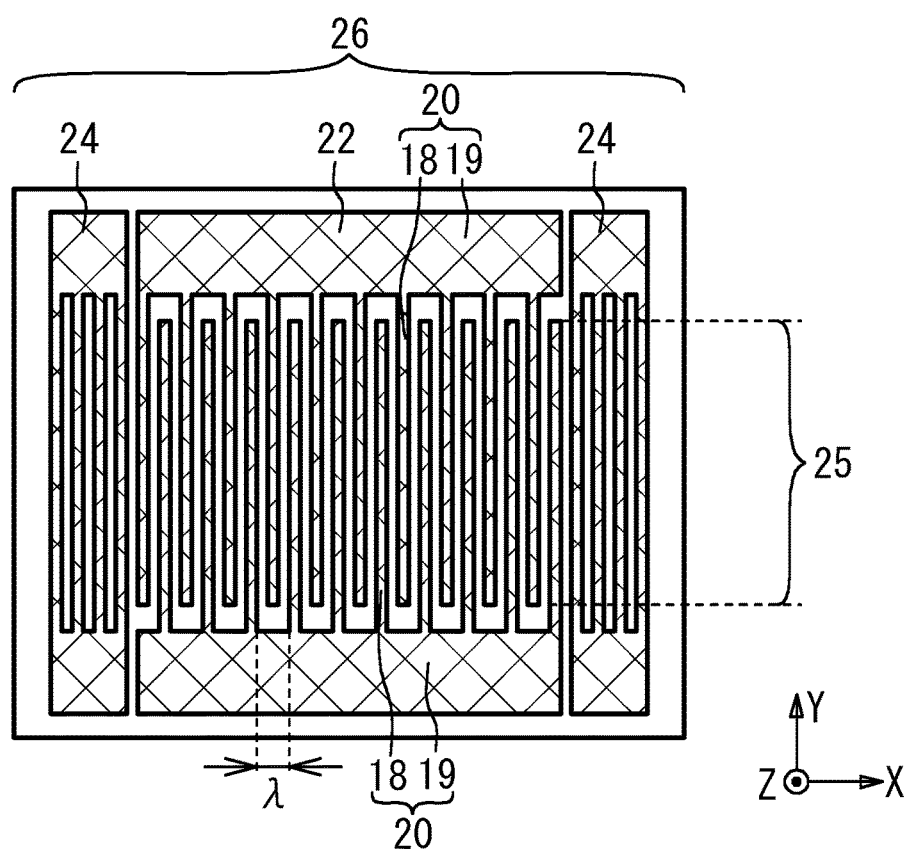
FIG. 1A and FIG. 1B are a plan view and a cross-sectional view of an acoustic wave resonator in accordance with a first embodiment, respectively.
Figure 1B:
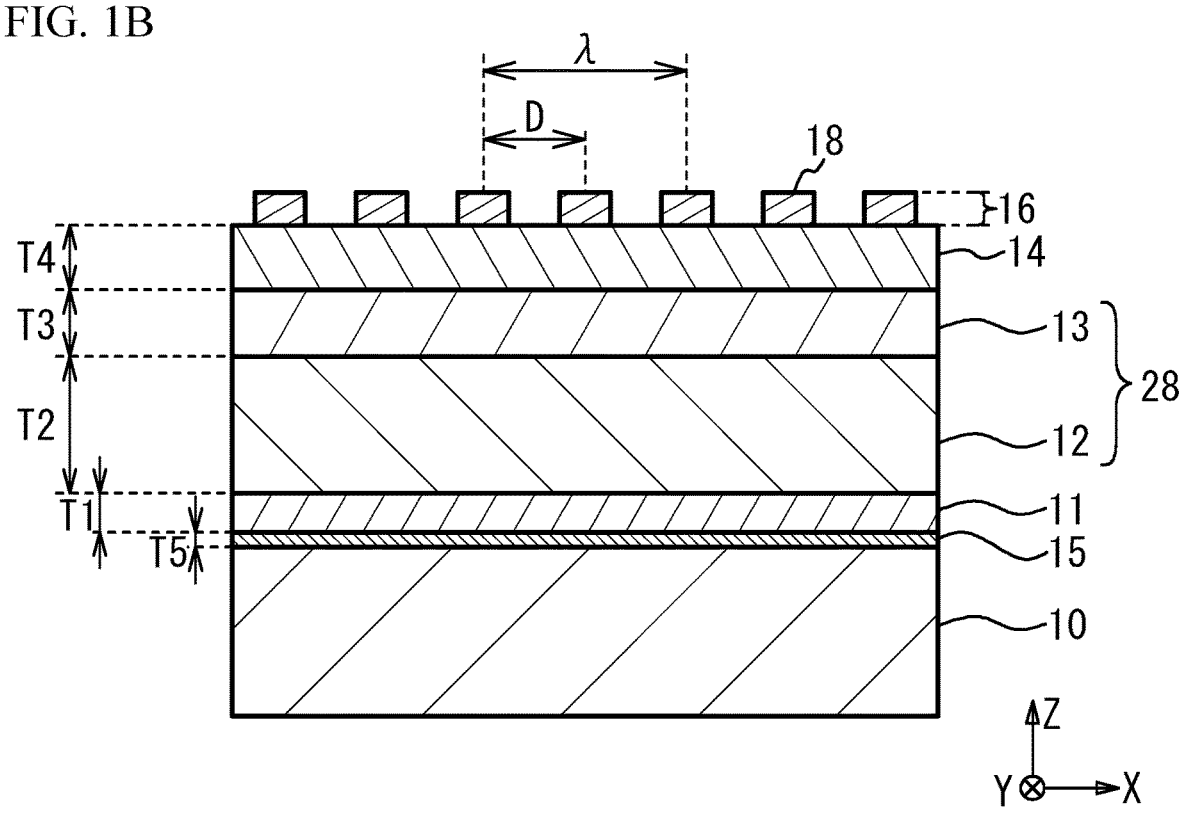

In a first embodiment, an example in which an acoustic wave device includes an acoustic wave resonator will be described. FIG. 1A and FIG. 1B are a plan view and a cross-sectional view of an acoustic wave resonator in accordance with the first embodiment, respectively. The direction in which electrode fingers are arranged (arrangement direction) is defined as an X direction, the direction in which the electrode fingers extend (extension direction) is defined as a Y direction, and the direction in which a support substrate and a piezoelectric layer are stacked (stacking direction) is defined as a Z direction. The X direction, the Y direction, and the Z direction do not necessarily correspond to the X-axis orientation and the Y-axis orientation of the crystal orientations of the piezoelectric layer. When the piezoelectric layer is a rotated Y-cut X-propagation substrate, the X direction is the X-axis orientation of the crystal orientations.

As illustrated in FIG. 1A and FIG. 1B, a piezoelectric layer 14 is provided over a support substrate 10. An intermediate layer 13 (fourth intermediate layer) is provided between the support substrate 10 and the piezoelectric layer 14. An intermediate layer 12 (fifth intermediate layer) is provided between the intermediate layer 13 and the support substrate 10. The intermediate layers 12 and 13 form an intermediate layer 28 (first intermediate layer). An intermediate layer 11 (second intermediate layer) is provided between the intermediate layer 28 and the support substrate 10. An intermediate layer 15 (third intermediate layer) is provided between the support substrate 10 and the intermediate layer 11. The thicknesses of the intermediate layers 15, 11, 12, and 13 and the piezoelectric layer 14 are represented by T5, T1, T2, T3, and T4, respectively.

An acoustic wave resonator 26 is provided on the piezoelectric layer 14. The acoustic wave resonator 26 has an interdigital transducer (IDT) 22 and reflectors 24. The reflectors 24 are provided at both sides of the IDT 22 in the X direction. The IDT 22 and the reflectors 24 are formed of a metal film 16 on the piezoelectric layer 14.

The IDT 22 includes a pair of comb-shaped electrodes 20 opposite to each other. The comb-shaped electrode 20 includes a plurality of electrode fingers 18 and a bus bar 19 to which the electrode fingers 18 are coupled. A region where the electrode fingers 18 of the pair of the comb-shaped electrodes 20 overlap is an overlap region 25. The length of the overlap region 25 is the aperture length. The electrode fingers 18 of one of the pair of the comb-shaped electrodes 20 and the electrode fingers 18 of the other of the pair of the comb-shaped electrodes 20 are alternately provided one by one in at least a part of the overlap region 25. The acoustic wave mainly excited by the electrode fingers 18 in the overlap region 25 propagates mainly in the X direction. The pitch of the electrode fingers 18 of one of the pair of the comb-shaped electrodes 20 is substantially equal to the wavelength λ of the acoustic wave. When the pitch of the plurality of the electrode fingers 18 (the pitch between the centers of the electrode fingers 18) is represented by D, the pitch of the electrode fingers 18 of one of the comb-shaped electrodes 20 is two times the pitch D of the electrode fingers 18. The reflectors 24 reflect the acoustic wave excited by the electrode fingers 18 of the IDT 22. As a result, the acoustic wave is confined within the overlap region 25 of the IDT 22.

The piezoelectric layer 14 is, for example, a monocrystalline lithium tantalate (LiTaO$_3$) layer, a monocrystalline lithium niobate (LiNbO$_3$) layer, or a monocrystalline quartz layer, and is, for example, a rotated Y-cut X-propagation lithium tantalate layer or a rotated Y-cut X-propagation lithium niobate layer. The thickness T4 of the piezoelectric layer 14 is preferably 1λ or less, and more preferably 0.5λ or less to reduce spurious emissions and loss. If the piezoelectric layer 14 is too thin, it becomes difficult to excite the acoustic wave. Therefore, the thickness T4 is preferably 0.12 or greater. Note that λ is 2×D, and D is the average pitch of the IDT 22 in the X direction. The average pitch D can be calculated by dividing the width of the IDT 22 in the X direction by the number of the electrode fingers 18.

The support substrate 10 is, for example, a sapphire substrate, an alumina substrate, a silicon substrate, a spinel substrate, a crystal substrate, a quartz substrate, or a silicon carbide substrate. The sapphire substrate is a monocrystalline Al$_2$O$_3$ substrate, the alumina substrate is a polycrystalline or amorphous Al$_2$O$_3$ substrate, the silicon substrate is a monocrystalline or polycrystalline silicon substrate, the spinel substrate is a polycrystalline or amorphous MgAl$_2$O$_4$ substrate, the quartz substrate is a monocrystalline SiO$_2$ substrate, the quartz substrate is a polycrystalline or amorphous SiO$_2$ substrate, and the silicon carbide substrate is a polycrystalline or monocrystalline SiC substrate. The linear coefficient of expansion of the support substrate 10 in the X direction is smaller than the linear coefficient of expansion of the piezoelectric layer 14 in the X direction. This configuration allows the temperature dependence of frequency of the acoustic wave resonator to be reduced.

The intermediate layer 13 is, for example, a temperature compensation film, and is an insulating layer having a temperature coefficient of an elastic constant opposite in sign to the temperature coefficient of the elastic constant of the piezoelectric layer 14. For example, the temperature coefficient of the elastic constant of the piezoelectric layer 14 is negative, and the temperature coefficient of the elastic constant of the intermediate layer 13 is positive. The intermediate layer 13 is, for example, a silicon oxide (SiO$_2$) layer that contains no additives or contains additive elements such as fluorine, and is, for example, polycrystalline or amorphous. This configuration allows the temperature coefficient of frequency of the acoustic wave resonator to be reduced. When the intermediate layer 13 is a silicon oxide layer, the acoustic velocity of a bulk wave propagating through the intermediate layer 13 is lower than the acoustic velocity of a bulk wave propagating through the piezoelectric layer 14.

In order for the intermediate layer 13 to have the function of temperature compensation, the energy of the acoustic wave of the main response is required to be present to some extent in the intermediate layer 13. Although the section where the energy of the surface acoustic wave is concentrated depends on the type of the surface acoustic wave, the energy of the surface acoustic wave is typically concentrated in the section from the upper surface of the piezoelectric layer 14 to a depth of 2λ (λ is the wavelength of the surface acoustic wave), and particularly concentrated in the section from the upper surface of the piezoelectric layer 14 to a depth of λ. Therefore, the distance (thickness T3+T4) from the lower surface of the intermediate layer 13 to the upper surface of the piezoelectric layer 14 is preferably 2λ or less, and more preferably 1λ or less.

The acoustic velocity of a bulk wave propagating through the intermediate layer 12 is higher than the acoustic velocity of a bulk wave propagating through the intermediate layer 13 and the piezoelectric layer 14. As a result, the energy of the acoustic wave of the main response is confined in the piezoelectric layer 14 and the intermediate layer 13. On the other hand, the acoustic wave of a high-frequency spurious response having a frequency higher than the frequency of the main response easily passes from the intermediate layer 13 to the intermediate layer 12. The unnecessary acoustic wave of the spurious response passing through the intermediate layer 12 is attenuated in the intermediate layer 12. For this reason, it is possible to reduce spurious emissions caused by the acoustic wave of the spurious response reflected by the upper surface of the support substrate 10 reaching the IDT 22. The intermediate layer 12 is, for example, polycrystalline or amorphous, and is an insulating layer such as an aluminum oxide layer, a silicon nitride layer, an aluminum nitride layer, an aluminum oxynitride film, or a silicon carbide layer. To confine the acoustic wave of the main response in the intermediate layer 13 and the piezoelectric layer 14, the thickness T2 of the intermediate layer 12 is greater than the thickness T3 of the intermediate layer 13, and is preferably 0.3λ or greater, for example, and more preferably 1λ or greater. To improve the characteristics, each of the thicknesses T1 and T2 is preferably 10λ or less.

The intermediate layer 11 is an attenuation layer that attenuates an unnecessary acoustic wave of a spurious response. This configuration reduces the spurious emission caused by the acoustic wave of the spurious response reflected by the upper surface of the support substrate 10 reaching the IDT 22. The intermediate layer 11 is a layer having voids such as pores, is, for example, a porous layer, and is, for example, a layer having a low density. Therefore, the material of the intermediate layer 11 is a material having a low Q factor of mechanical vibration. The material of the intermediate layer 11 may be the same as or different from that of the intermediate layer 12. The intermediate layer 11 is, for example, an inorganic insulator such as an aluminum oxide film, a silicon nitride film, an aluminum nitride film, an aluminum oxynitride film, or a silicon carbide film, an organic insulator such as a resin, or a conductor. The acoustic velocity of the bulk wave in the intermediate layer 11 may be higher or lower than the acoustic velocity of the bulk wave in the intermediate layer 12. The thickness T1 of the intermediate layer 11 is preferably, for example, 0.2λ or greater, more preferably 0.5λ or greater. The thickness T1 of the intermediate layer 11 is, for example, 10λ or less.

The intermediate layer 15 is denser than the intermediate layer 11 and is a layer having a small porosity. For example, the intermediate layer 15 has almost no voids such as pores and has a porosity of approximately 0%. The intermediate layer 15 is polycrystalline or amorphous, for example, and is an aluminum oxide layer, a silicon nitride layer, a silicon oxide film, an aluminum nitride layer, an aluminum oxynitride film, or a silicon carbide layer.

The metal film 16 is a film containing, for example, aluminum (Al), copper (Cu), or molybdenum (Mo) as a main component. An adhesion film such as a titanium (Ti) film, a chromium (Cr) film, or a titanium nitride (TiN) film may be provided between the electrode fingers 18 and the piezoelectric layer 14. The adhesion film is thinner than the electrode fingers 18. An insulating layer may be provided so as to cover the electrode fingers 18. The insulating layer functions as a protective film or a temperature compensation film.

The wavelength λ of the acoustic wave is, for example, 1 μm to 6 μm. When two electrode fingers 18 are defined as a pair, the number of pairs of the electrode fingers 18 is, for example, 20 to 300. The duty ratio of the IDT 22 is calculated by dividing the width of the electrode finger 18 by the pitch of the electrode fingers 18, i.e., (the width of the electrode finger 18)/(the pitch of the electrode fingers 18), and is, for example, 30% to 70%. The aperture length of the IDT 22 is, for example, 10λ to 50λ.

Manufacturing Method of First Embodiment

Figure 2A:
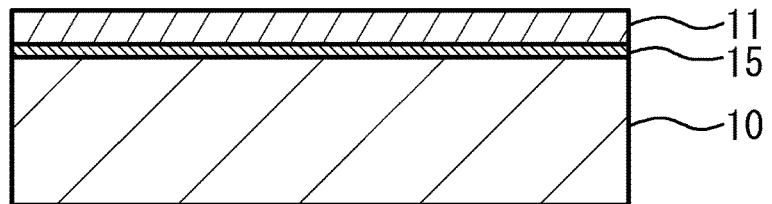
FIG. 2A to FIG. 2D are cross-sectional views illustrating a method of manufacturing the acoustic wave resonator in accordance with the first embodiment.
Figure 2A:
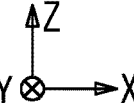

FIG. 2A to FIG. 2D are cross-sectional views illustrating a method of manufacturing the acoustic wave resonator in accordance with the first embodiment. As illustrated in FIG. 2A, the intermediate layers 15 and 11 are formed on the support substrate 10. The intermediate layers 15 and 11 are formed by, for example, sputtering. The intermediate layers 15 and 11 may be formed using the same film-forming apparatus or different film-forming apparatuses. When the intermediate layers 15 and 11 are formed using the same film-forming apparatus, by using different film-forming conditions for the intermediate layers 15 and 11, pores can be formed in the intermediate layer 11 while almost no pores are formed in the intermediate layer 15. For example, when the intermediate layers 15 and 11 are made of aluminum oxide and are formed by sputtering, the power (direct current (DC) power and/or radio frequency (RF) power) for forming the intermediate layer 11 is adjusted to be lower than the power for forming the intermediate layer 15, whereby the intermediate layer 15 can be a dense layer having almost no pores and the intermediate layer 11 can be a layer having pores or the like.

Figure 2B:
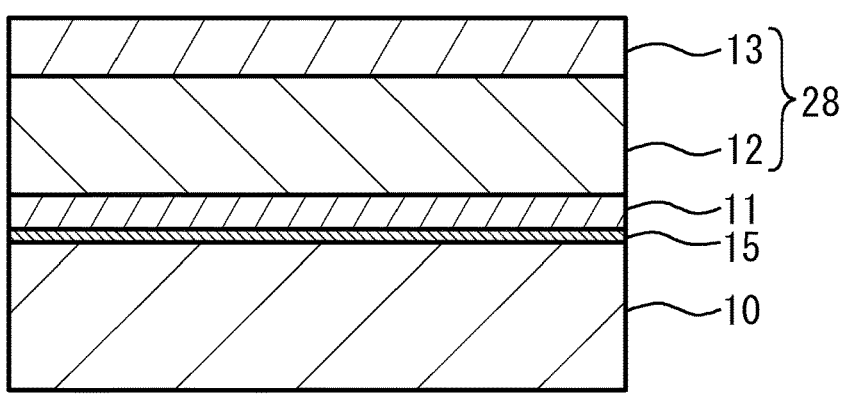
Figure 2B:
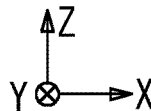

As illustrated in FIG. 2B, the intermediate layers 12 and 13 are formed as the intermediate layer 28 on the intermediate layer 11. For example, a chemical vapor deposition (CVD) method is used to form the intermediate layers 12 and 13. The intermediate layers 11 and 12 may be formed using the same film-forming apparatus or different film-forming apparatuses. When the intermediate layers 11 and 12 are formed using the same film-forming apparatus, it is possible to form pores in the intermediate layer 11 and not to form a pore in the intermediate layer 12 by using different film-forming conditions for the intermediate layers 11 and 12. By forming the intermediate layers 15, 11, and 12 in the same apparatus, the adhesion of each layer can be improved because each layer is not exposed to the air after being formed.

Figure 2C:
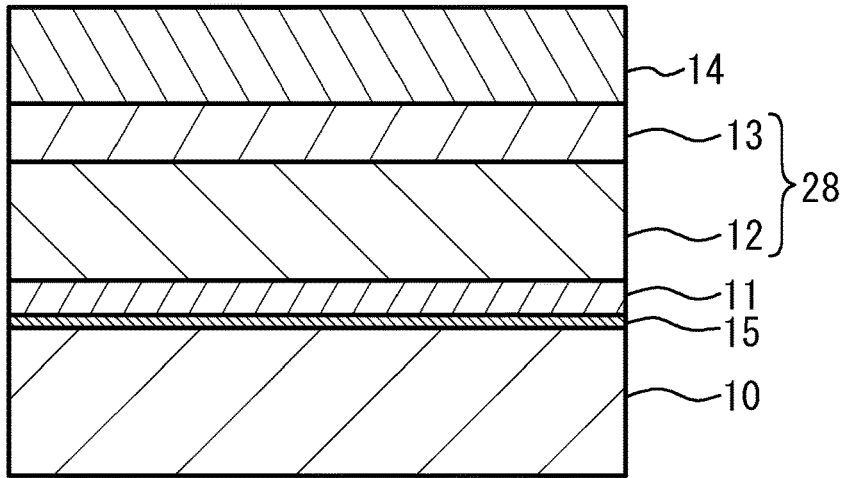
Figure 2C:
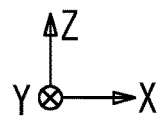

As illustrated in FIG. 2C, the piezoelectric layer 14 is bonded onto the intermediate layer 28. For example, a surface activation method is used to bond the piezoelectric layer 14. A bonding layer may be formed between the intermediate layer 28 and the piezoelectric layer 14.

Figure 2D:
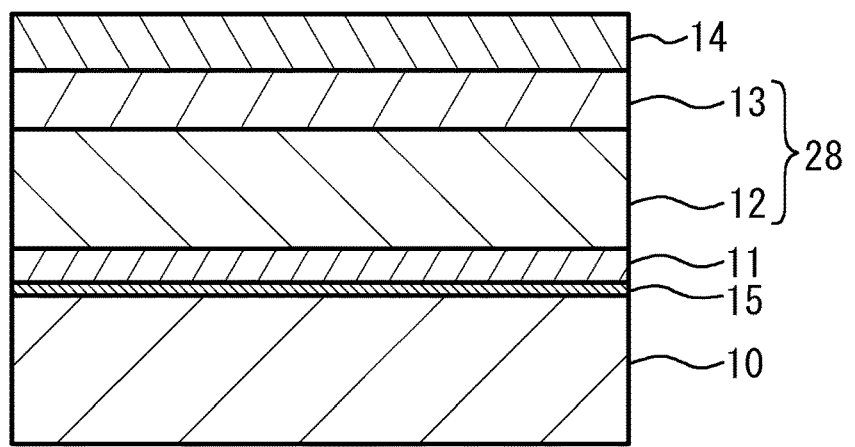
Figure 2D:
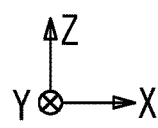

As illustrated in FIG. 2D, the piezoelectric layer 14 is thinned by polishing the upper surface of the piezoelectric layer 14 using, for example, a chemical mechanical polishing (CMP) method. Thereafter, as illustrated in FIG. 1A and FIG. 1B, the acoustic wave resonator 26 is formed on the piezoelectric layer 14 using the metal film 16.

Experiment 1

Samples with different densities of the intermediate layer 11 were prepared and the high-frequency spurious emission was measured. The sample preparation conditions are as follows.

Wavelength λ (2×D): 2 μm

Metal film 16: Aluminum film

Piezoelectric layer 14: 42° rotated Y-cut X-propagation lithium tantalate substrate with a thickness T4 of 0.3λ

Intermediate layer 13: Silicon oxide layer with a thickness T3 of 0.2λ

Intermediate layer 12: Aluminum oxide layer with a thickness T2 of 3λ and a density of 3.2 g/cm$^3$ Intermediate layer 11: Aluminum oxide layer with a thickness of 1λ

Intermediate layer 15: Aluminum oxide layer with a thickness of 30 nm and a density of 3.2 g/cm$^3$ or greater Support substrate 10: Sapphire substrate with a density of 4.0 g/cm$^3$ The intermediate layers 15, 11 and 12 were formed in the same CVD apparatus. The density of the intermediate layer 11 was measured using an aluminum oxide film formed under the same film-forming conditions as the intermediate layer 11.

Figure 3:
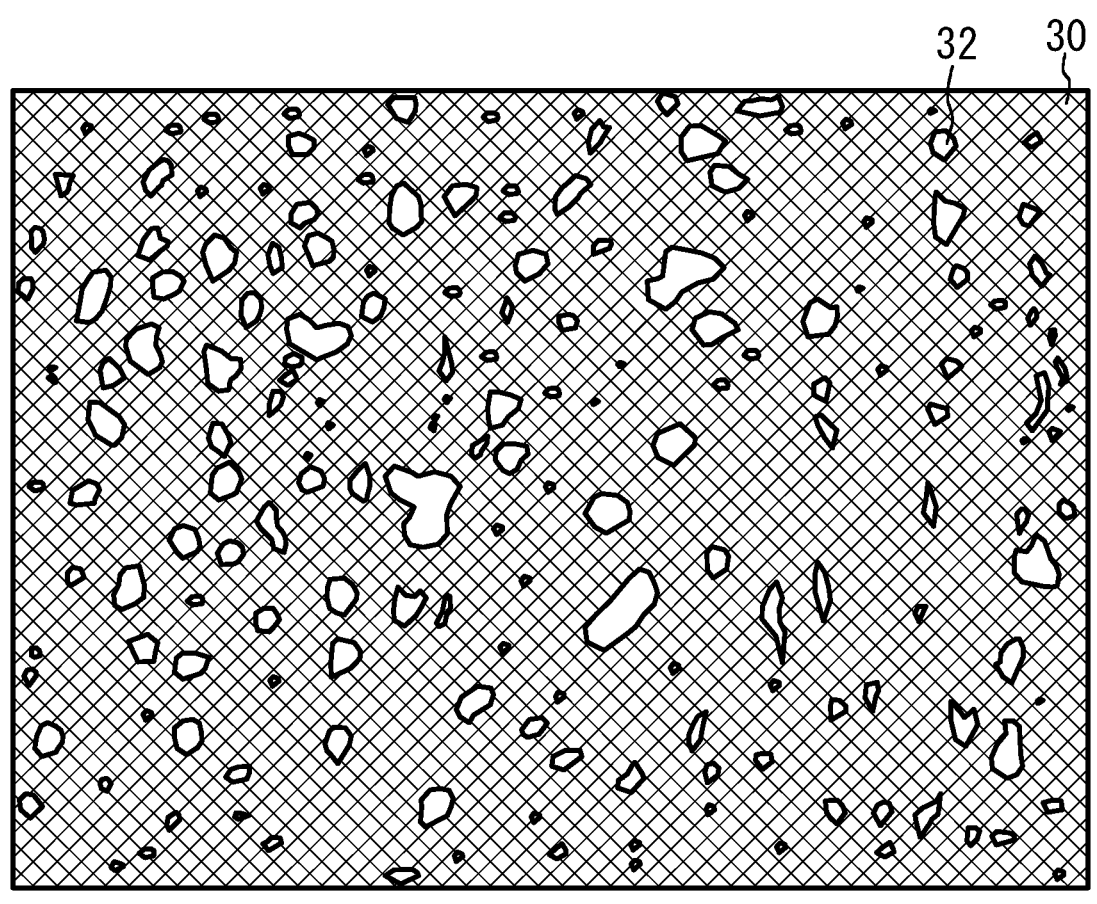
FIG. 3 is a schematic cross-sectional view of an intermediate layer 11 in Experiment 1.

FIG. 3 is a schematic cross-sectional view of the intermediate layer 11 in Experiment 1. FIG. 3 schematically illustrates a transmission electron microscope (TEM) image when an aluminum oxide layer having a density of 2.85 g/cm$^3$ was formed under the same film-forming conditions as those of the intermediate layer 11. As illustrated in FIG. 3, pores 32 are provided in an aluminum oxide 30, and the diameter of the pore 32 is several nanometers to several hundred nanometers. In the TEM image when the aluminum oxide layer was formed using the film-forming conditions of the intermediate layers 15 and 12, the pores 32 are hardly observed.

Figure 4:
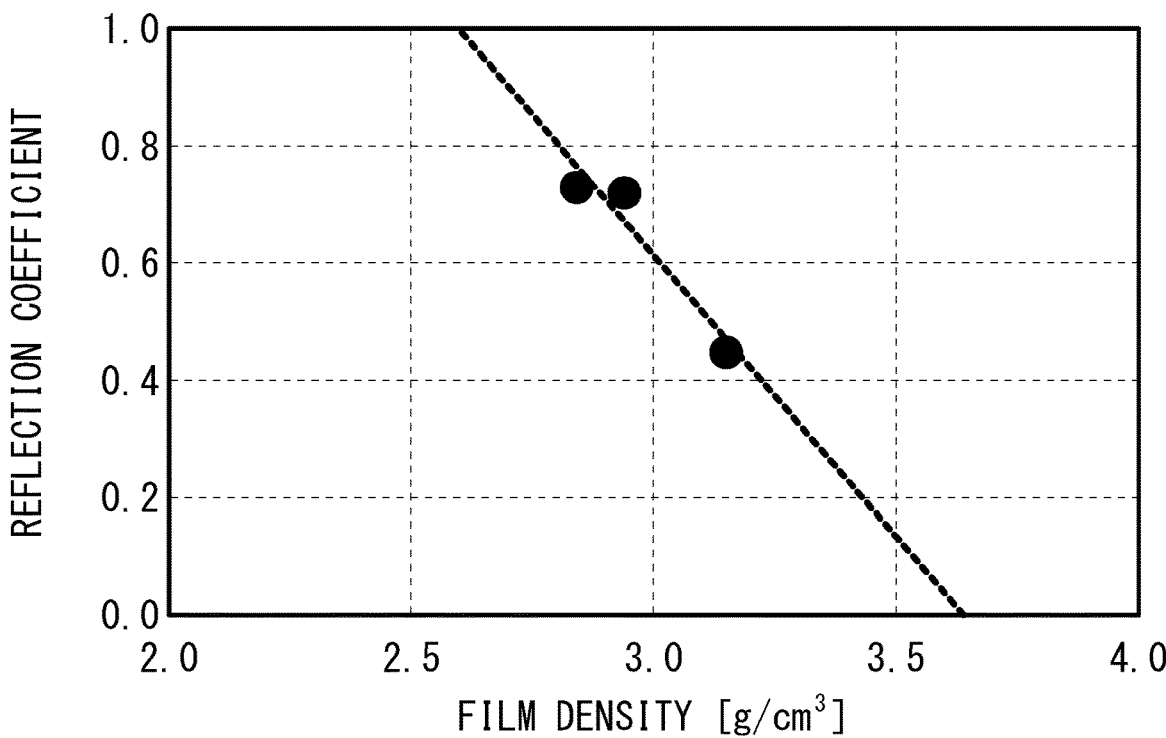
FIG. 4 is a graph of the reflection coefficient of a spurious response versus the density of the intermediate layer 11 in the first embodiment.

FIG. 4 is a graph of the reflection coefficient of the spurious response versus the density of the intermediate layer 11 in Example 1. Dots are measurement points, and a straight line is an approximate straight line. When the reflection coefficient S11 of the acoustic wave resonator is represented in a Smith chart, if a spurious response occurs, S11 draws a circle from the outer periphery of the Smith chart toward the center of the Smith chart. The reflection coefficient on the vertical axis is an index represented by a moving radius when a point closest to the center of the circle due to the spurious response is represented by polar coordinates with the moving radius of the outer periphery of the Smith chart being 1. A reflection coefficient close to 1 in FIG. 4 corresponds to a small spurious response.

As presented in FIG. 4, as the density of the intermediate layer 11 decreases, the spurious response decreases. Thus, the density of the intermediate layer 11 correlates with the porosity of the intermediate layer 11. When the intermediate layer 11 is dense and has a porosity of approximately 0%, the density of the aluminum oxide is approximately 3.2 g/cm$^3$. As the porosity of the intermediate layer 11 increases, the density decreases. For example, in the intermediate layer 11 having a density lower by 10% than the intermediate layers 15 and 12 having a porosity of approximately 0%, the porosity is about 5% to 10%.

When the intermediate layer 11 is directly formed on the support substrate 10 without providing the intermediate layer 15, the intermediate layer 11 is peeled off from the support substrate 10. According to the experiment by the inventors, when the intermediate layer 11 with a density of 3.0 g/cm$^3$ or less is formed, the intermediate layer 11 may be peeled off from the support substrate 10. This is considered due to the reduced adhesion between the intermediate layer 11 and the support substrate 10 because the pores 32 are provided in the intermediate layer 11.

Experiment 2

Samples having different thicknesses T5 of the intermediate layer 15 were prepared. The density of the intermediate layer 11 is 2.85 g/cm$^3$.

First, the thickness T5 of the intermediate layer 15 was set to 0 nm, 15 nm, 50 nm, and 300 nm to check whether film peeling occurred after forming the intermediate layers 15, 11, 12, and 13 as illustrated in FIG. 2B. Film peeling occurred in the sample with a thickness T5 of 0 nm (that is, the sample in which the intermediate layer 15 was not formed). On the other hand, in the samples with thicknesses T5 of 15 nm, 50 nm, and 300 nm, film peeling did not occur.

Figure 5A:
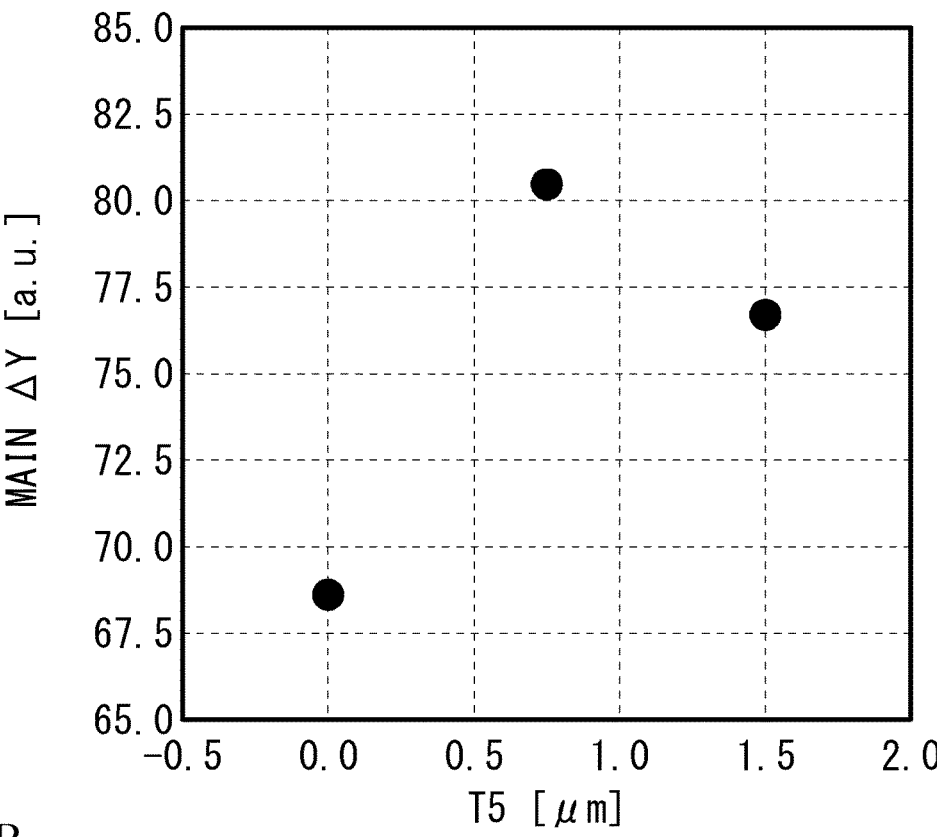
FIG. 5A and FIG. 5B are graphs of the main $\Delta Y$ and a reflection coefficient versus a thickness T5 in Experiment 2.
Figure 5B:
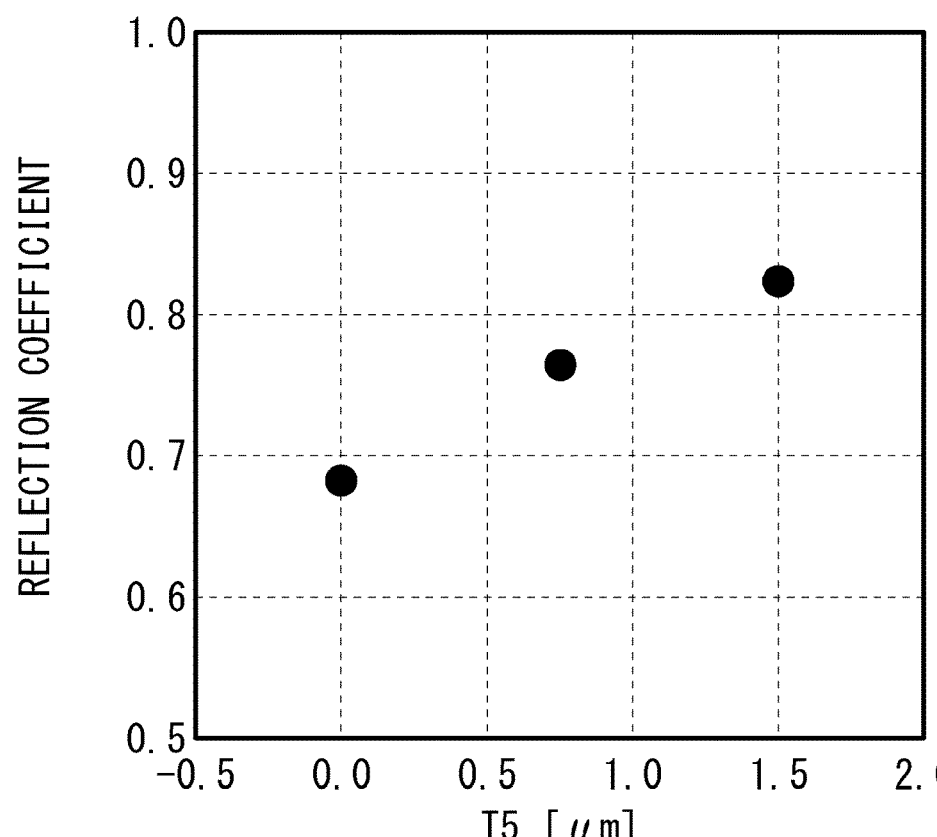

Next, the acoustic wave resonators 26 were fabricated by setting the thickness T5 of the intermediate layer 15 to 0 nm, 750 nm, and 1500 nm. FIG. 5A and FIG. 5B are graphs presenting the main ΔY and the reflection coefficient with respect to the thickness T5 in Experiment 2, respectively. The main ΔY indicates the absolute value of the admittance at the resonant frequency and the anti-resonant frequency in arbitrary units, and a large main ΔY indicates good characteristics of the main response. The reflection coefficient is the reflection ratio of the spurious response and is the same index as the reflection coefficient in FIG. 3. The main ΔY and the reflection coefficient indicate average values in the fabricated wafer.

As presented in FIG. 5A, the main ΔY is larger when the thickness T5 is 750 nm or 1500 nm than when the thickness T5 is 0 μm. The reason why the main ΔY is small when the thickness T5 is 0 μm is considered because the intermediate layer 11 is peeled off from the support substrate 10 in some portions of the wafer. The main ΔY for a thickness T5 of 750 nm is substantially the same as the main ΔY for a thickness T5 of 1500 nm. There is almost no deterioration of the main ΔY even when the thickness T5 is 1500 nm.

As presented in FIG. 5B, the reflection coefficient of the spurious response is substantially the same as the reflection coefficient for a density of 3.0 g/cm$^3$ or less in FIG. 4, and is substantially constant regardless of the thickness T5 of the intermediate layer 15. It seems that the reflection coefficient is slightly improved as the thickness T5 is increased. As presented in FIG. 5A and FIG. 5B, even when the intermediate layer 15 has a thickness T5 of 1500 nm, there is no deterioration of the characteristics and no deterioration of the effect of reducing spurious response.

In the first embodiment, the porosity of the intermediate layer 11 is higher than the porosity of the intermediate layer 12. This configuration attenuates the acoustic wave of a spurious response that passes from the piezoelectric layer 14 through the intermediate layer 28, is reflected by the support substrate 10, and reaches the IDT 22. However, when the intermediate layer 11 is in contact with the support substrate 10, the adhesion between the intermediate layer 11 and the support substrate 10 is deteriorated, and the intermediate layer 11 is easily peeled off from the support substrate 10. Therefore, the intermediate layer 15 having a porosity lower than the porosity of the intermediate layer 11 is provided between the support substrate 10 and the intermediate layer 11. This configuration makes it difficult for the intermediate layer 11 to be peeled off from the support substrate 10.

When the porosity of the intermediate layer 28 close to the piezoelectric layer 14 is high, the acoustic wave of the main response may be attenuated, and the characteristics of the main response may be deteriorated. Therefore, the porosity of the intermediate layer 28 is preferably 3% or less, and more preferably 1% or less. When the porosity of the intermediate layer 15 is high, the intermediate layer 15 is easily peeled off from the support substrate 10. In this respect, the porosity of the intermediate layer 15 is preferably 3% or less, and more preferably 1% or less. To attenuate the acoustic wave of the spurious response, the porosity of the intermediate layer 11 is preferably 5% or greater, more preferably 7% or greater, and further preferably 10% or greater. If the porosity of the intermediate layer 11 is too high, the mechanical strength of the intermediate layer 11 decreases. In this respect, the porosity of the intermediate layer 11 is preferably 50% or less, and more preferably 20% or less.

When the Q factor of the mechanical vibration decreases, the attenuation coefficient of the acoustic wave increases and the acoustic wave is likely to be attenuated. Therefore, the Q factor of the intermediate layer 11 is lower than the Q factor of the intermediate layer 28, and the Q factor of the intermediate layer 15 is higher than the Q factor of the intermediate layer 11. The Q factor of the intermediate layer 11 is preferably 0.8 times the Q factors of the intermediate layers 15 and 12 and more preferably equal to or less than 0.5 times the Q factors of the intermediate layers 15 and 12.

When the intermediate layers 11 and 15 are made of the same material, the intermediate layers 11 and 15 can be formed in the same film-forming apparatus as illustrated in FIG. 2A. Therefore, since the surface of the intermediate layer 15 is not exposed to the atmosphere, the adhesion between the intermediate layers 11 and 15 can be improved. When the intermediate layers 11 and 15 are made of the same material, the density of the intermediate layer 11 is preferably equal to or less than 0.95 times the density of the intermediate layer 15, more preferably equal to or less than 0.93 times the density of the intermediate layer 15, and is preferably equal to or greater than 0.8 times the density of the intermediate layer 15.

When the intermediate layers 11 and 12 are made of the same material, the intermediate layers 11 and 12 can be formed in the same film-forming apparatus. In this case, since the surface of the intermediate layer 11 is not exposed to the air, the adhesion between the intermediate layers 11 and 12 can be improved. When the intermediate layers 11 and 12 are made of the same material, the density of the intermediate layer 11 is preferably equal to or less than 0.95 times the density of the intermediate layer 12, more preferably equal to or less than 0.93 times the density of the intermediate layer 12, and is preferably equal to or greater than 0.8 times the density of the intermediate layer 12.

To prevent the intermediate layer 15 from being peeled off from the support substrate 10, the thickness T5 of the intermediate layer 15 is preferably 15 nm or greater, and more preferably 50 nm or greater. In order not to deteriorate the characteristics, the thickness T5 of the intermediate layer 15 is preferably 1500 nm or less, and more preferably 1000 nm or less.

To attenuate the acoustic wave of the spurious response, the thickness T1 of the intermediate layer 11 is preferably equal to or greater than 0.4 times the average pitch D of the electrode fingers 18 (0.2λ or greater) and more preferably equal to or greater than 1.0 times the average pitch D of the electrode fingers 18 (0.5λ or greater). To reduce the decrease in mechanical strength, the thickness T1 of the intermediate layer 11 is preferably equal to or less than 10 times the average pitch D of the electrode fingers 18 (5λ or less), and more preferably equal to or less than 5 times the average pitch D of the electrode fingers 18 (2.5λ or less).

The intermediate layer 13 is formed of a silicon oxide film, and the intermediate layer 12 is formed of an aluminum oxide film, an aluminum nitride film, an aluminum oxynitride film, a silicon nitride film, or a silicon carbide film. Thus, the intermediate layer 13 functions as a temperature compensation film, and the intermediate layer 12 functions as a boundary layer that confines the acoustic wave of the main response to the piezoelectric layer 14 and the intermediate layer 13 and attenuates the acoustic wave of the spurious response. The silicon oxide film functions as a temperature compensation film and may contain an impurity such as fluorine. The content percentage of silicon oxide in the silicon oxide film is 50 mol % or greater, 80 mol % or greater, or 90 mol % or greater. The content percentages of aluminum oxide, aluminum nitride, aluminum oxynitride, silicon nitride, and silicon carbide in the aluminum oxide film, the aluminum nitride film, the aluminum oxynitride film, the silicon nitride film, and the silicon carbide film, respectively, are, for example, 90 mol % or greater.

The piezoelectric layer 14 is a monocrystalline lithium tantalate substrate or a monocrystalline lithium niobate substrate. In this case, in particular, the acoustic wave of the spurious response becomes a problem. Therefore, it is preferable to provide the intermediate layers 11 and 15.

To allow the energy of the acoustic wave of the main response to be present in the intermediate layer 13, the thickness T4 of the piezoelectric layer 14 is preferably equal to or less than two times the average pitch D of the electrode fingers 18, and more preferably equal to or less than one time the average pitch D of the electrode fingers 18. To allow the piezoelectric layer 14 to function, the thickness T4 of the piezoelectric layer 14 is preferably equal to or greater than 0.1 times the average pitch D of the electrode fingers 18, and more preferably equal to or greater than 0.2 times the average pitch D of the electrode fingers 18.

First Variation of First Embodiment

Figures 6A, 6B:
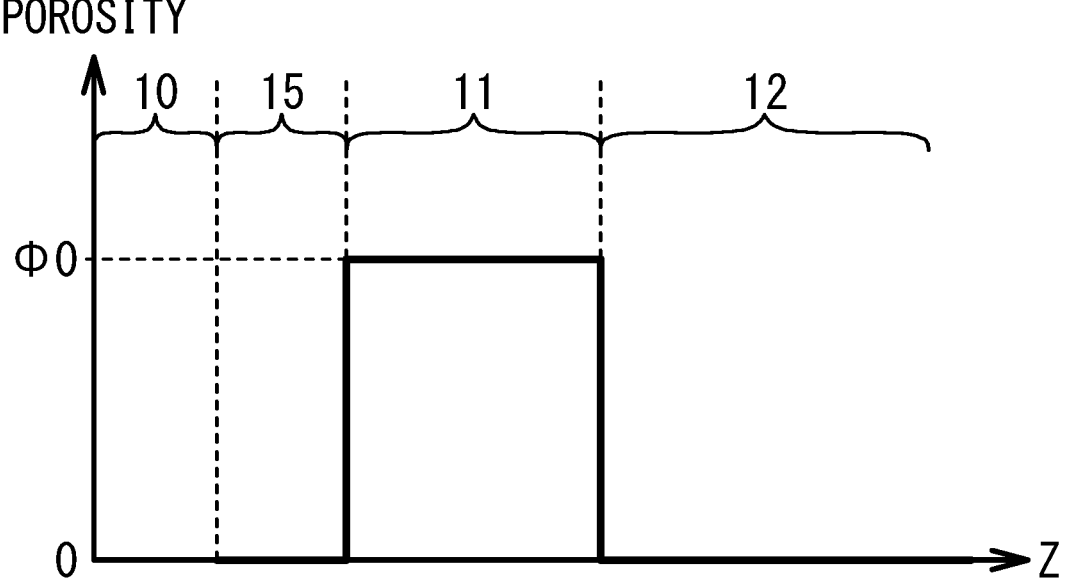
FIG. 6A and FIG. 6B are graphs of porosity versus Z in the first embodiment and a first variation of the first embodiment, respectively.

FIG. 6A and FIG. 6B are graphs of the porosity versus Z in the first embodiment and a first variation of the first embodiment, respectively. Z represents the position in the Z direction (thickness direction), and the porosity represents the porosities of the intermediate layers 15, 11, and 12. The porosity φ of the intermediate layer 11 is defined by the ratio of the volume of pores to the total volume of the intermediate layer 11 including the pores. For example, the porosity can be calculated using an electron microscope image such as a TEM image.

As presented in FIG. 6A, in the first embodiment, the porosities of the intermediate layers 15 and 12 are approximately 0%. The porosity φ0 of the intermediate layer 11 is substantially constant and is, for example, 10%. As presented in FIG. 6B, in the first variation of the first embodiment, a transition layer 15a is provided between the intermediate layers 15 and 11, and a transition layer 15b is provided between the intermediate layers 11 and 12. In the transition layer 15a, the porosity gradually increases from approximately 0% to φ0 by changing the film-forming conditions while forming the transition layer 15a. In the transition layer 15b, the porosity gradually decreases from φ0 to approximately 0% by changing the film-forming conditions while forming the transition layer 15b. The porosity with respect to Z may vary in a curvilinear manner. As in the first variation of the first embodiment, the transition layer 15a may be provided between the intermediate layers 15 and 11. The transition layer 15b may be provided between the intermediate layers 11 and 12. One of the transition layers 15a and 15b may be omitted.

Second Embodiment

Figure 7:
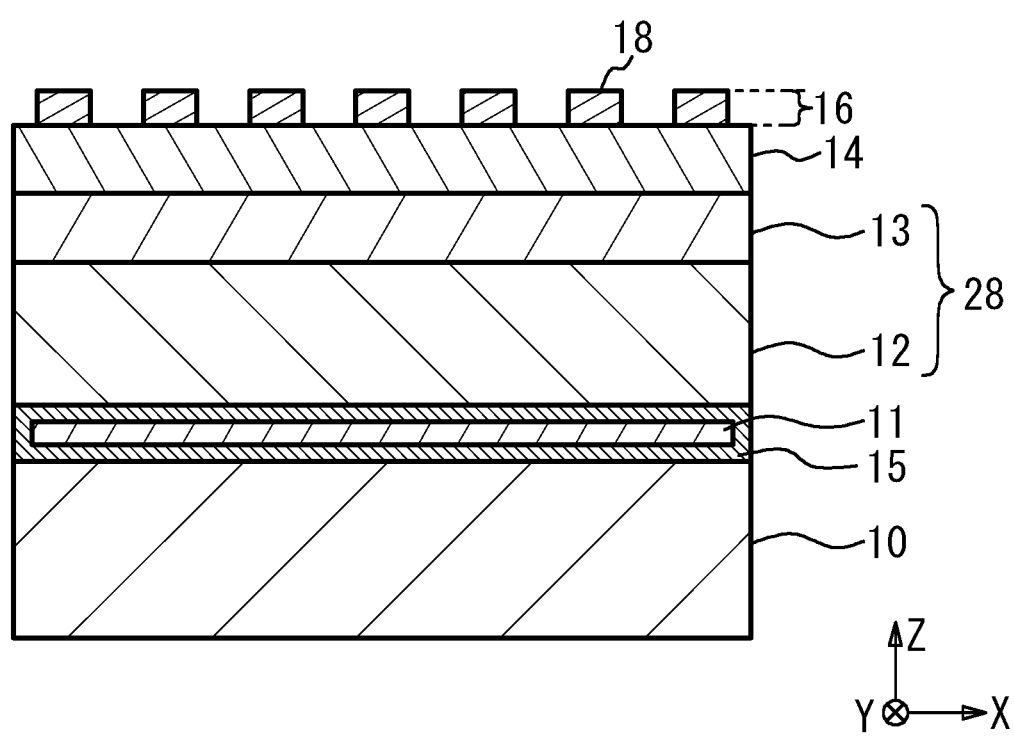
FIG. 7 is a cross-sectional view of an acoustic wave resonator in accordance with a second embodiment.

FIG. 7 is a cross-sectional view of an acoustic wave resonator in accordance with a second embodiment. As illustrated in FIG. 7, the intermediate layers 15 is provided between the support substrate 10 and the intermediate layer 11, between the intermediate layers 11 and 12, and on the side surfaces of the intermediate layer 11. Other configurations are the same as those of the first embodiment, and description thereof will be omitted.

Figures 8A, 8B, 8C, 8D, 8E:
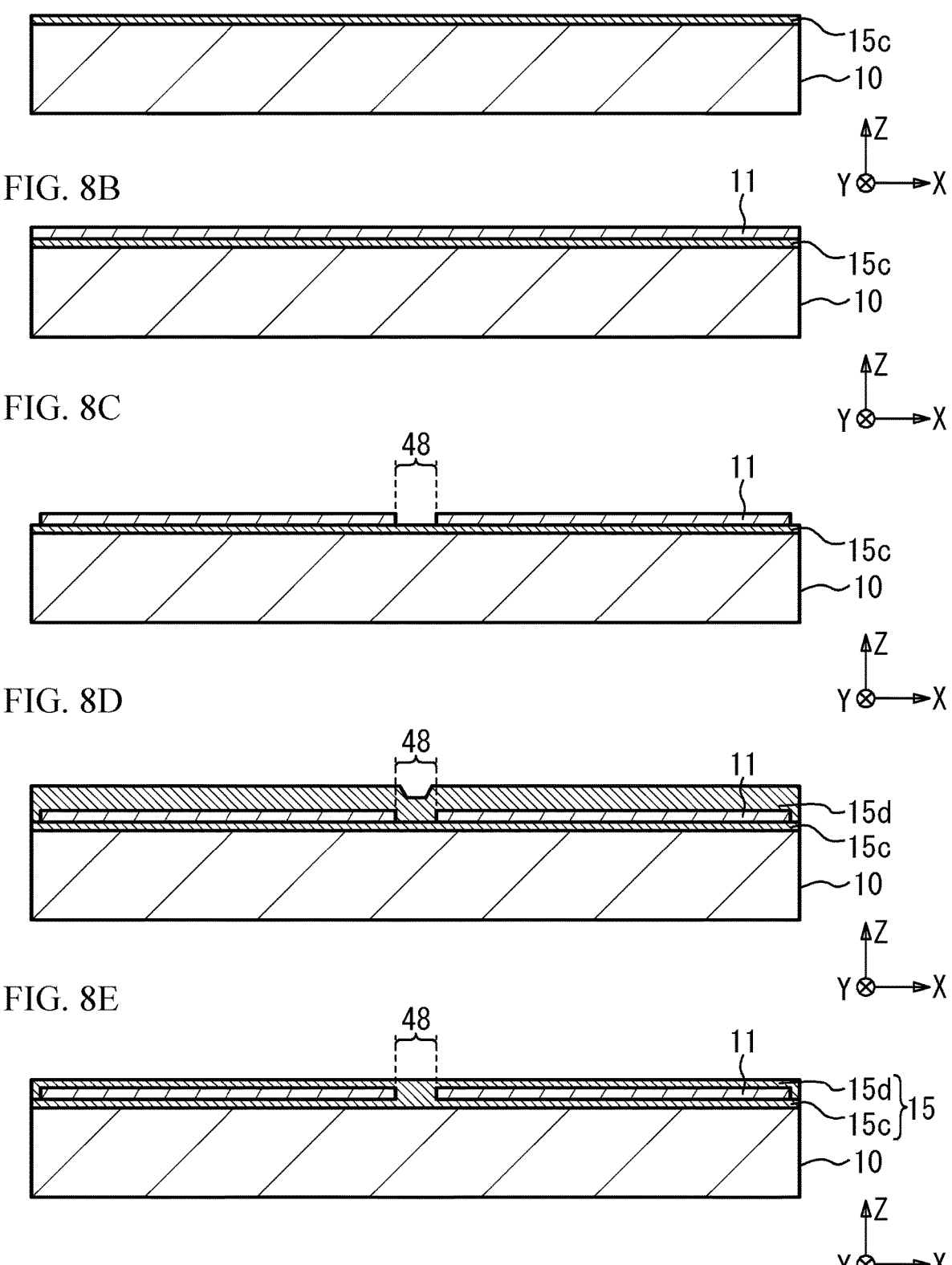
FIG. 8A to FIG. 8E are cross-sectional views illustrating a method of manufacturing the acoustic wave resonator in accordance with the second embodiment.

FIG. 8A to FIG. 9C are cross-sectional views illustrating a method of manufacturing the acoustic wave resonator in accordance with the second embodiment. As illustrated in FIG. 8A, an intermediate layer 15c is formed on the support substrate 10. The intermediate layer 15c is, for example, a layer with a porosity of approximately 0% and is, for example, a silicon oxide film.

As illustrated in FIG. 8B, the intermediate layer 11 is formed on the intermediate layer 15c. The material of the intermediate layer 11 may be the same as or different from that of the intermediate layer 15c. The intermediate layer 11 is a layer with a large porosity and is, for example, an aluminum oxide layer.

As illustrated in FIG. 8C, the intermediate layer 11 is patterned. The intermediate layer 11 in a region corresponding to a scribe line 48 is removed. As illustrated in FIG. 8D, an intermediate layer 15d is formed on the intermediate layer 11. The intermediate layer 15d is, for example, a layer with a porosity of approximately 0% and made of, for example, the same material as that of the intermediate layer 15c. The material of the intermediate layer 15d may be different from that of the intermediate layer 15c.

As illustrated in FIG. 8E, the upper surface of the intermediate layer 15d is planarized. For example, a CMP method is used to planarize the intermediate layer 15d. As a result, the intermediate layer 15 is formed of the intermediate layers 15c and 15d.

Figures 9A, 9B, 9C:
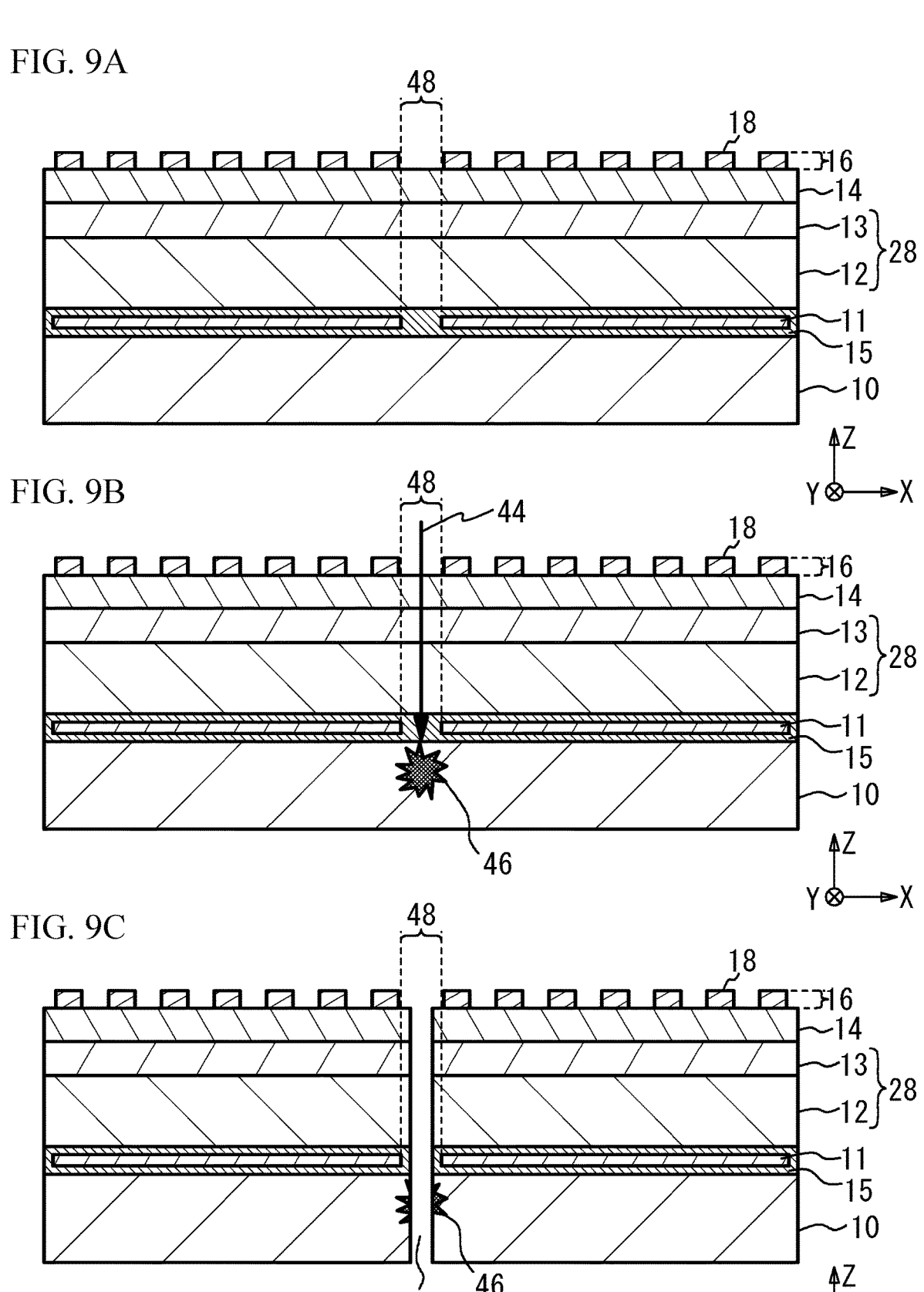
FIG. 9A to FIG. 9C are cross-sectional views illustrating the method of manufacturing the acoustic wave resonator in accordance with the second embodiment.

As illustrated in FIG. 9A, the intermediate layers 12 and 13 and the piezoelectric layer 14 are formed on the intermediate layer 15 by performing the same steps as those illustrated in FIG. 2B to FIG. 2D of the first embodiment. Similarly to FIG. 1B, the acoustic wave resonator 26 made of the metal film 16 is formed on the piezoelectric layer 14.

As illustrated in FIG. 9B, a laser beam 44 is emitted into the support substrate 10 at the scribe line 48. Thereby, an altered region 46 of the support substrate 10 is formed in the support substrate 10. The altered region 46 is a region where the support substrate 10 becomes amorphous or polycrystalline due to the heat of the laser beam 44.

As illustrated in FIG. 9C, a blade is applied to the scribe line 48 from above the piezoelectric layer 14 or from below the support substrate 10. As a result, a crack 45 is formed in the support substrate 10 and the acoustic wave resonators are separated into individual acoustic wave resonators. As described above, a technique of forming the altered region 46 in the support substrate 10 by irradiation with the laser beam 44 and cleaving the support substrate 10 to separate the support substrate 10 into individual pieces is referred to as a stealth dicing (registered trademark) technique.

The width of the scribe line 48 can be reduced by using the stealth dicing (registered trademark) technique. However, the stealth dicing (registered trademark) technique cannot be used for layers with high porosity, such as the intermediate layer 11, because the laser beam 44 is scattered. In the second embodiment, the intermediate layer 11 is not provided in the scribe line 48, and thus the stealth dicing (registered trademark) technique can be used.

In addition, since the dense intermediate layer 15 is provided on the side surfaces of the intermediate layer 11, it is possible to inhibit moisture or the like from entering the intermediate layer 11 from the side surface.

In the first and second embodiments, when the acoustic wave of the main response is a shear horizontal (SH) wave, the spurious response is particularly problematic. When the piezoelectric layer 14 is a 30° to 60° rotated Y-cut X-propagation lithium tantalate substrate, the SH wave becomes the main mode. Therefore, when the piezoelectric layer 14 is a 30° to 60° (or 36° to 50°) rotated Y-cut X-propagation lithium tantalate substrate, it is preferable to provide the intermediate layers 11 and 15. The acoustic wave may be a Lamb wave or the like other than the surface acoustic wave.

Third Embodiment

Figure 10A:
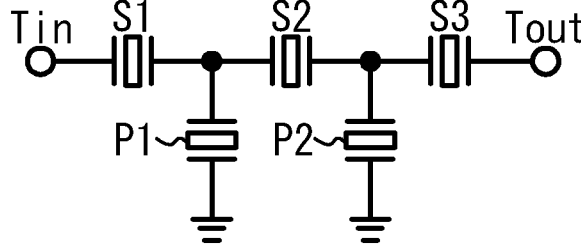
FIG. 10A is a circuit diagram of a filter in accordance with a third embodiment.

FIG. 10A is a circuit diagram of a filter in accordance with a third embodiment. As illustrated in FIG. 10A, one or more series resonators S1 to S3 are connected in series between an input terminal Tin and an output terminal Tout. One or more parallel resonators P1 and P2 are connected in parallel between the input terminal Tin and the output terminal Tout. The acoustic wave resonator according to any one of the first and second embodiments and the variation thereof may be used for at least one of the following resonators: the one or more series resonators S1 to S3 and the one or more parallel resonators P1 and P2. The number of resonators of the ladder-type filter can be set as appropriate. The filter may be a multi-mode filter.

First Variation of Third Embodiment

Figure 10B:
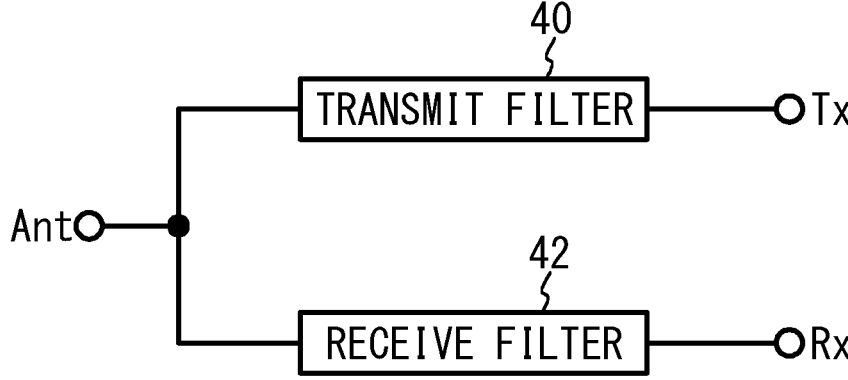
FIG. 10B is a circuit diagram of a duplexer in accordance with a first variation of the third embodiment.

FIG. 10B is a circuit diagram of a duplexer in accordance with a first variation of the third embodiment. As illustrated in FIG. 10B, a transmit filter 40 is connected between a common terminal Ant and a transmit terminal Tx. A receive filter 42 is connected between the common terminal Ant and a receive terminal Rx. The transmit filter 40 transmits signals in the transmit band among high-frequency signals input from the transmit terminal Tx to the common terminal Ant as transmission signals, and suppresses signals of other frequencies. The receive filter 42 transmits signals in the receive band among high-frequency signals input from the common terminal Ant to the receive terminal Rx as reception signals, and suppresses signals of other frequencies. At least one of the transmit filter 40 or the receive filter 42 may be the filter of the third embodiment.

Although the duplexer has been described as an example of the multiplexer, the multiplexer may be a triplexer or a quadplexer.

Although the embodiment of the present invention has been described in detail above, the present invention is not limited to the specific embodiment, and various modifications and changes can be made within the scope of the gist of the present invention described in the claims.

What is claimed is:

1. An acoustic wave device comprising:
   a support substrate;
   a piezoelectric layer provided on the support substrate;
   at least one pair of comb-shaped electrodes provided on the piezoelectric layer, the at least one pair of comb-shaped electrodes including a plurality of electrode fingers;
   a first intermediate layer provided between the support substrate and the piezoelectric layer;
   a second intermediate layer provided between the support substrate and the first intermediate layer, the second intermediate layer having a porosity higher than a porosity of the first intermediate layer; and
   a third intermediate layer provided between the support substrate and the second intermediate layer, the third intermediate layer having a porosity lower than the porosity of the second intermediate layer.

2. The acoustic wave device according to claim 1, wherein the first intermediate layer has a porosity of 3% or less, wherein the second intermediate layer has a porosity of 5% or greater, and wherein a porosity of the third intermediate layer is 3% or less.

3. The acoustic wave device according to claim 1, wherein the second intermediate layer and the third intermediate layer are made of the same material.

4. The acoustic wave device according to claim 1, wherein the third intermediate layer has a thickness of 15 nm or greater and 1500 nm or less.

5. The acoustic wave device according to claim 1, wherein the third intermediate layer is provided between the second intermediate layer and the first intermediate layer and on a side surface of the second intermediate layer.

6. The acoustic wave device according to claim 1, wherein the first intermediate layer includes: a fourth intermediate layer that is a silicon oxide film; and a fifth intermediate layer that is provided between the silicon oxide film and the second intermediate layer and is an aluminum oxide film, an aluminum nitride film, an aluminum oxynitride film, a silicon nitride film, or a silicon carbide film.

7. The acoustic wave device according to claim 6, wherein the piezoelectric layer is a monocrystalline lithium tantalate substrate or a monocrystalline lithium niobate substrate.

8. The acoustic wave device according to claim 1, wherein a thickness of the piezoelectric layer is equal to or less than two times an average pitch of the plurality of electrode fingers.

9. A filter comprising the acoustic wave device according to claim 1.

10. A multiplexer comprising the filter according to claim 9.

11. An acoustic wave device comprising:
a support substrate;
a piezoelectric layer provided on the support substrate;
at least one pair of comb-shaped electrodes provided on the piezoelectric layer, the at least one pair of comb-shaped electrodes including a plurality of electrode fingers;
a first intermediate layer provided between the support substrate and the piezoelectric layer;
a second intermediate layer provided between the support substrate and the first intermediate layer, the second intermediate layer having a Q factor smaller than a Q factor of the first intermediate layer; and
a third intermediate layer provided between the support substrate and the second intermediate layer, the third intermediate layer having a Q factor larger than the Q factor of the second intermediate layer.

12. The acoustic wave device according to claim 11, wherein the second intermediate layer and the third intermediate layer are made of the same material.

13. The acoustic wave device according to claim 11, wherein the third intermediate layer has a thickness of 15 nm or greater and 1500 nm or less.

14. The acoustic wave device according to claim 11, wherein the third intermediate layer is provided between the second intermediate layer and the first intermediate layer and on a side surface of the second intermediate layer.

15. The acoustic wave device according to claim 11, wherein the first intermediate layer includes: a fourth intermediate layer that is a silicon oxide film; and a fifth intermediate layer that is provided between the silicon oxide film and the second intermediate layer and is an aluminum oxide film, an aluminum nitride film, an aluminum oxynitride film, a silicon nitride film, or a silicon carbide film.

16. The acoustic wave device according to claim 15, wherein the piezoelectric layer is a monocrystalline lithium tantalate substrate or a monocrystalline lithium niobate substrate.

17. The acoustic wave device according to claim 11, wherein a thickness of the piezoelectric layer is equal to or less than two times an average pitch of the plurality of electrode fingers.

18. A filter comprising the acoustic wave device according to claim 11.

19. A multiplexer comprising the filter according to claim 18.

* * * * *